(12) United States Patent
Gambino et al.

(10) Patent No.: US 9,018,754 B2
(45) Date of Patent: Apr. 28, 2015

(54) HEAT DISSIPATIVE ELECTRICAL ISOLATION/INSULATION STRUCTURE FOR SEMICONDUCTOR DEVICES AND METHOD OF MAKING

(71) Applicant: International Business Machines Corporation, Armonk, NY (US)

(72) Inventors: Jeffrey P. Gambino, Westford, VT (US); Qizhi Liu, Lexington, MA (US); Zhenzhen Ye, South Burlington, NY (US); Yan Zhang, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/041,716

(22) Filed: Sep. 30, 2013

(65) Prior Publication Data

US 2015/0091129 A1    Apr. 2, 2015

(51) Int. Cl.
*H01L 23/10* (2006.01)
*H01L 21/00* (2006.01)
*H01L 29/06* (2006.01)
*H01L 21/762* (2006.01)

(52) U.S. Cl.
CPC ...... *H01L 29/0649* (2013.01); *H01L 21/76224* (2013.01); *H01L 21/7624* (2013.01)

(58) Field of Classification Search
CPC .................... H01L 21/76224; H01L 21/7624; H01L 21/76229; H01L 28/0649; H01L 29/0642; H01L 29/0649; H01L 29/7624
USPC .......... 257/507, 706, 707, 723; 438/122, 142, 438/106
See application file for complete search history.

(56) References Cited

U.S. PATENT DOCUMENTS

| | | | |
|---|---|---|---|
| 6,476,483 B1 | 11/2002 | Adler et al. | |
| 6,483,147 B1 | 11/2002 | Lin | |
| 6,696,103 B1 | 2/2004 | Shimoda et al. | |
| 6,956,289 B2* | 10/2005 | Kunikiyo | 257/758 |
| 7,029,951 B2 | 4/2006 | Chen et al. | |
| 7,183,640 B2* | 2/2007 | Mazzochette et al. | 257/703 |

(Continued)

FOREIGN PATENT DOCUMENTS

| | | |
|---|---|---|
| CN | 1227400 A | 9/1999 |
| EP | 2454752 A1 | 5/2012 |

(Continued)

OTHER PUBLICATIONS

Parke et al., "A Method to Overcome Self-Heating Effects in SOI MOSFETs", Journal of Nanjing Normal University Engineering and Technology, vol. 3, No. 4, 2003.

*Primary Examiner* — Nikolay Yushin
(74) *Attorney, Agent, or Firm* — Anthony J. Canale; Hoffman Warnick LLC

(57) ABSTRACT

An isolation structure can include a structure material with thermal conductivity greater than silicon dioxide, yet electrical conductivity such that the structure material can replace silicon dioxide as an insulator. At least one column can extend to a target layer from a top surface of a semiconductor device near an active area of the device. At least one lateral portion can extend from the column(s) substantially parallel to the target layer and can extend between multiple columns in the target layer, such as in a cavity formed by lateral etching. The structure material can include, for example, aluminum nitride (AlN).

19 Claims, 6 Drawing Sheets

(56) References Cited

U.S. PATENT DOCUMENTS

| | | |
|---|---|---|
| 7,307,269 B2 | 12/2007 | Kim et al. |
| 7,772,609 B2 | 8/2010 | Yan |
| 8,053,870 B2 | 11/2011 | Anderson et al. |
| 8,133,774 B2 * | 3/2012 | Botula et al. .................. 438/164 |
| 8,198,150 B1 | 6/2012 | Yegnashankaran |
| 2004/0222528 A1 * | 11/2004 | Kunikiyo ..................... 257/758 |
| 2008/0048196 A1 | 2/2008 | Strittmatter et al. |
| 2010/0164093 A1 | 7/2010 | Mowry et al. |
| 2012/0146098 A1 | 6/2012 | Dahlstrom et al. |
| 2013/0001655 A1 | 1/2013 | Huang et al. |

FOREIGN PATENT DOCUMENTS

| | | |
|---|---|---|
| JP | 63023342 A | 1/1988 |
| JP | 11054939 A | 2/1999 |
| KR | 100249846 B1 | 3/2000 |

* cited by examiner

US 9,018,754 B2

HEAT DISSIPATIVE ELECTRICAL ISOLATION/INSULATION STRUCTURE FOR SEMICONDUCTOR DEVICES AND METHOD OF MAKING

BACKGROUND

The present invention relates to microfabrication of semiconductor devices, and, more specifically, to structures and methods for thermally conductive electrical isolation and/or insulation in semiconductor devices.

Semiconductor devices and components thereof continue to decrease in size, resulting in increasing significance of device self-heating. Some devices, such as transistors, can suffer degraded performance from elevated operating temperatures. The relatively low thermal conductivity of dielectrics typically used in such devices contributes to self-heating, particularly in silicon on insulator (SOI) based semiconductor devices.

SUMMARY

According to one embodiment of the present invention, a structure for a semiconductor device can include an active area in at least one layer of a semiconductor device, the at least one layer including a target layer below the active area, and an upper boundary layer between the target layer and the active area. At least one column of a structure material can extend from a top of the semiconductor device through the upper boundary layer to the target layer. At least one lateral portion of the structure material can extend from the at least one column below and substantially parallel to the upper boundary layer.

Another embodiment of the invention disclosed herein includes a method in which an active area of a substrate can be designated, the substrate including a target layer below the active area and at least one of an upper boundary layer between the target layer and the active area or a lower boundary layer below the target layer. At least one column of a substantially non-metallic structure material can be formed adjacent the active area from a top of the substrate to the target layer. In addition, at least one lateral portion of the structure material can be formed to extend from the at least one column in the target layer.

An additional embodiment of the invention disclosed herein can take the form of a design structure readable by a machine used in design, manufacture, or simulation of an integrated circuit, the design structure comprising an active area in at least one layer of a semiconductor device and a target layer below the active area. At least one of a lower boundary layer below the target layer and an upper boundary layer between the target layer and the active area can be included. At least one column of a structure material can extend from a top of the semiconductor device to the target layer, and at least one lateral portion of the structure material can extend from the at least one column.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 6 also shows line 5-5 indicating the section used for FIG. 3.

DETAILED DESCRIPTION

Figure 1:
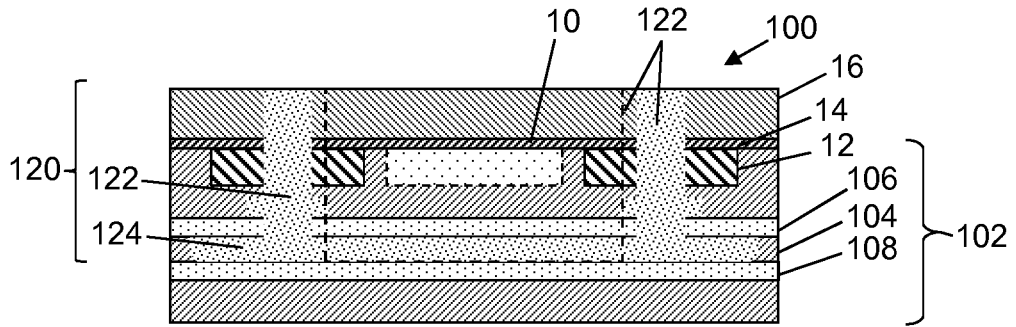
FIGS. 1-5 are schematic cross-sectional views of stages of fabrication of a heat dissipative electrical isolation/insulation structure according to an embodiment of the invention disclosed herein and showing stages of fabrication thereof.

Bulk silicon (Si) substrates can be effective heat sinks, but typically have poor electrical isolation properties, while silicon dioxide ($SiO_2$), such as a buried oxide layer of silicon-on-insulator (SOI) substrates, can provide effective electrical isolation, but typically degrades heat dissipation. Therefore, it is desirable to improve both heat dissipation as well as electrical isolation/insulation properties of bulk semiconductor and SOI devices. Various improved electrically insulating heat dissipation techniques and/or structures have been developed, most of which involve the use of a metal or another electrical conductor due to the generally superior heat transfer properties thereof. For example, one technique forms aluminum plugs in portions of a semiconductor device to transfer heat away from active areas. A variant of this type of approach takes advantage of aluminum spiking, in which aluminum at an aluminum-semiconductor interface can grow spikes that extend into the semiconductor material when exposed to suitable temperatures for suitable periods during microfabrication. Another approach forms a liner of an electrical insulator on a surface of a trench formed near an active area, such as through a shallow trench isolation (STI) structure, and then deposits a thermal conductor in the lined trench, which thermal conductor is also an electrical conductor. The liner can be made from, for example, boron-phosphorous-doped silicon glass (BPSG) or any other suitable electrical insulator, and the thermal conductor can include polysilicon, tungsten, and various metals alone or in combination.

Embodiments of the invention disclosed herein provide an electrical isolation structure and method of making for semiconductor devices that offers improved thermal conductivity and/or heat dissipation without using an electrical conductor as part of the structure. As a result of implementing embodiments, heat can be dissipated from components and/or devices and/or structures in semiconductor devices while retaining electrical isolation, which can lengthen operational life and/or improve performance. Embodiments introduce a method of making a heat dissipative electrical insulation structure as an early back end of line (BEOL) process, which can avoid contaminating delicate parts of a semiconductor device during front end of line (FEOL) processes and can simplify incorporation of the inventive structure and/or method into existing microfabrication systems and/or processes.

A structure according to embodiments of the invention can be formed in a semiconductor device with an active area in a substrate, the substrate including a target layer below the active area, the structure including at least one column of a structure material that can extend from a top of the semiconductor device to the target layer and through any intervening layer and/or material. The structure can also include at least one lateral portion extending substantially parallel to the target layer from the at least one column. With appropriate selection of the structure material, embodiments provide improved thermal conductivity and heat dissipation while maintaining a desired level of electrical insulation and/or isolation and could replace STI structures.

In the following description, various components will be described in various stages of fabrication of embodiments of the inventive heat dissipative electrical isolation structure disclosed herein, and it is well within the purview of one of ordinary skill in the semiconductor manufacturing arts to choose appropriate techniques and/or processes for the fabrication of the various components and to achieve intermediate states between the various stages shown and described. Examples of semiconductor fabrication techniques that can be employed in various stages include shallow trench isolation (STI), deposition processes, such as, for example, physical vapor deposition (PVD), chemical vapor deposition (CVD), electrochemical deposition (ECD), molecular beam epitaxy (MBE), and atomic layer deposition (ALD); removal processes, such as, for example, wet etching, dry etching, and chemical-mechanical planarization (CMP); patterning/lithography, such as photomasking, exposing, and/or ashing; and/or electrical property modification, such as by doping by diffusion, ion implantation, dielectric constant reduction via ultraviolet light exposure, and/or annealing.

With reference to FIG. 1, a portion of an example of a semiconductor device 100, such as an integrated circuit (IC), is shown as it might appear with a first example of a heat dissipative electrical isolation structure 120 according to embodiments of the invention disclosed herein, which can be formed after FEOL processes have completed, yet before or at least early in BEOL processes. Device 100 can include a semiconductor substrate 102 in which at least one active area 10 can be formed and/or designated, such as during FEOL processes. Because embodiments can be employed with any device, no specific device is identified in active area 10, but those of ordinary skill in the art should recognize that one or more transistors, resistors, capacitors, inductors, diodes, and/or any other suitable device and/or any combination thereof can be formed in active area 10 within the scope of embodiments of the invention disclosed herein. Also, as well known to those skilled in the art, while active area 10 is shown with a top surface that is substantially planar, this is for convenience, since active area 10 is usually not planar. For example, the polysilicon gates of complementary metal-oxide-semiconductor (CMOS) field-effect transistors (FETs) would be deposited over gate oxide that is formed on the surface of active Si area. In embodiments, at least one STI structure 12 can be formed in substantially a same layer or level of device 100 as active area 10. Each STI structure 12 in such embodiments can include a portion of a STI barrier layer 14 thereon. Embodiments can be implemented to replace STI structure(s) 12, however, and so such STI structure(s) 12 and barrier layer 14 may be omitted. As is typical in the art, FIG. 1 shows a blanket electrical insulator layer 16, such as BPSG, formed over the entire substrate 102.

Figure 6:
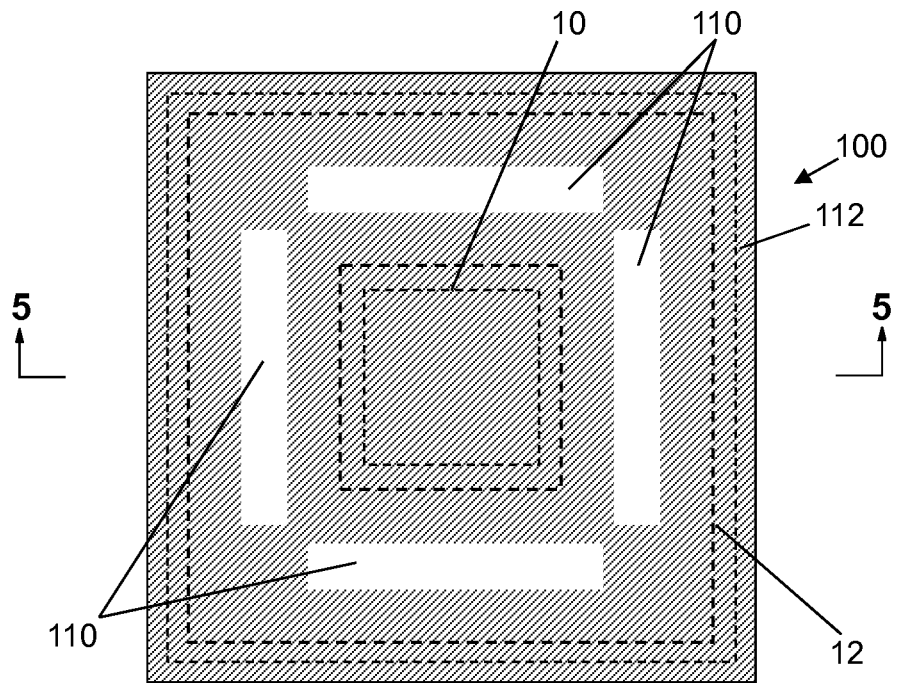
FIG. 6 is a schematic plan view of the heat dissipative electrical isolation/insulation structure shown in FIG. 5 and taken from view line 6-6 therein according to an embodiment of the invention disclosed herein.

Heat dissipative electrical isolation structure 120 can include at least one column 122 of structure material extending from a top of semiconductor device 100 to at least one lateral portion 124 of structure material. In the cross sectional view of FIG. 1, columns 122 not sectioned but which may be of note are shown in dashed lines and can be located where respective trenches 110 of FIG. 6 are shown. In the example of FIG. 1, at least one lateral portion 124 can extend from at least one column 122, connecting two or more columns 122 in embodiments, and can extend substantially parallel to the top of semiconductor device 100. For example, lateral portion(s) 124 can be formed in a target and/or sacrificial layer 104 in substrate 102 below active area 10, which in embodiments can take the form of an intermediate layer between upper and lower boundary layers 106, 108 below active area 10.

In embodiments, substrate 102 can take the form of a bulk semiconductor substrate and one or both of upper and lower boundary layers 106, 108 can be a form of etch stop layer, such as a layer of modified bulk semiconductor material. For example, where substrate 102 includes bulk silicon, one or both of upper and lower boundary layers 106, 108 can be modified by adding germanium (Ge) to form a respective silicon-germanium (SiGe) layer, which can act as an etch stop layer as is known in the art. One way to form a SiGe layer can include epitaxial deposition during preparation of substrate 102, and additional layers of Si and/or SiGe and/or other materials can be formed thereafter, though other techniques can be employed as may be suitable and/or desired. As another example, one or both of boundary layers 106, 108 can be formed by doping with an impurity, such as by high energy implantation of a p-type impurity like boron (B), which in embodiments can be performed after formation of active area 10 if desired and/or suitable.

Figure 2:
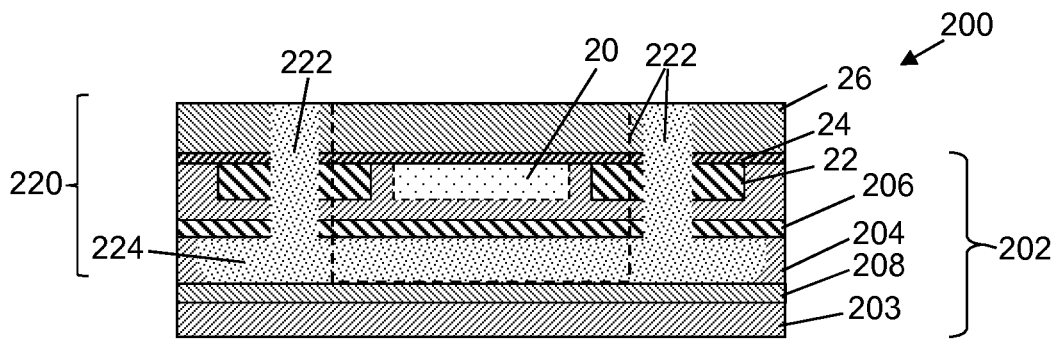

Another portion of a semiconductor device 200 can be seen in FIG. 2 as it might appear with another embodiment of a heat dissipative electrical isolation structure 220 according to embodiments of the invention disclosed herein, but in which substrate 202 is a silicon-on-insulator (SOI) substrate. Semiconductor device 200 can include an active area 20 that can be electrically isolated, such as with STI structures 22, which can each bear a portion of a barrier layer 24 thereon. A blanket electrical insulator layer 26, such as a doped glass layer, can be formed atop SOI substrate 202 over active area 20 and/or STI structures 22 and barrier layer 24. SOI substrate 202 can also include a handle wafer 203 and a BOX layer 206 between handle wafer 203 and active area 20.

As in the example of FIG. 1, heat dissipative electrical isolation structure 220 can include at least one column 222 extending from a top of semiconductor device 200 to at least one lateral portion 224 of structure material extending from column(s) 222. For example, a lateral portion 224 can connect two or more columns 222 and can extend substantially parallel to BOX layer 206 and/or to the top of semiconductor device 200. In embodiments, lateral portion(s) 224 can be formed in a target and/or sacrificial layer 204 below and substantially parallel to BOX layer 206, and a lower boundary layer 208 can also be included, such as to act as an etch stop layer, as will be described below.

Figure 3:
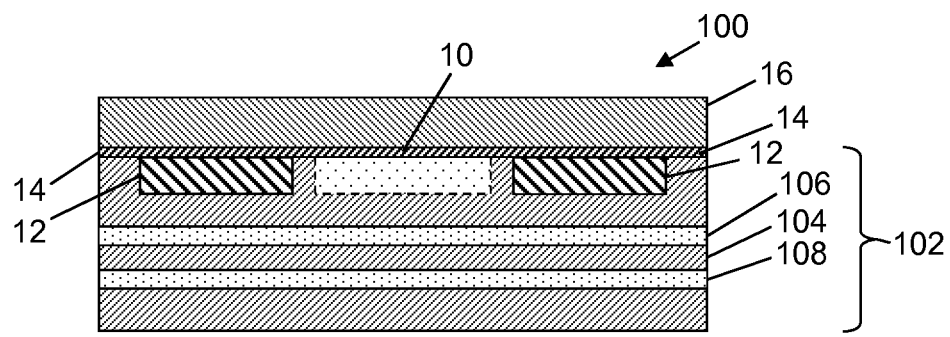

With reference to FIG. 3, an initial stage of embodiments can include a portion of an example of a semiconductor device 100, such as an integrated circuit (IC), and is shown as it might appear after FEOL processes have completed, yet before or at least early in BEOL processes. Device 100 can include semiconductor substrate 102 in which at least one active area 10 can be formed and/or designated, such as during FEOL processes. Because embodiments can be employed with any device, as suggested above, no specific device is identified in active area 10, but those of ordinary skill in the art should recognize that one or more transistors, resistors, capacitors, inductors, diodes, and/or any other suitable device and/or any combination thereof can be formed in active area 10 within the scope of embodiments of the invention disclosed herein. Also, as suggested above and as is well known to those skilled in the art, active area 10 is usually not planar and is shown as such in the FIGS. for convenience. For example, as indicated above, the polysilicon gates of complementary metal-oxide-semiconductor (CMOS) field-effect transistors (FETs), would typically be deposited over gate oxide that can be formed on a surface of active area 10.

In embodiments, at least one STI structure 12 can be formed in substantially a same layer or level of device 100 as active area 10. Each STI structure 12 in such embodiments can include a portion of a STI barrier layer 14 thereon. Embodiments can be implemented to replace STI structure(s) 12, however, and so such STI structure(s) 12 and barrier layer 14 may be omitted. In embodiments, barrier layer 14 can include a portion over active area 10 and/or can be substantially contiguous over STI structure(s) 12 and/or active area 10 and/or other portions of semiconductor device 100 as may be suitable, desired, and/or convenient. As is typical in the art, FIG. 3 shows a blanket electrical insulator layer 16, such as BPSG, formed over the entire substrate 102.

Substrate 102 in embodiments can include a target layer 104, which can be and/or include a sacrificial layer, below active area 10, though such a target layer 104 can be formed as part of the inventive method of embodiments, if necessary. For example, target layer 104 can take the form of an intermediate layer between upper and lower boundary layers 106, 108 below active area 10. Target layer 104 in this example can be defined by upper and lower boundary layers 106, 108, which can be present in substrate 102 prior to implementation of embodiments. Where one or both of boundary layers 106, 108 are not present, embodiments can include formation of one or both of boundary layers 106, 108 using any suitable process as is known in the art and/or as may be developed. It should be noted that in this example, lower boundary layer 108 could be considered a target layer because trench(es) 110 can extend all the way to a top surface thereof, but lower boundary layer 108 here acts as a stop layer such that trench(es) 110 will not go beyond target layer 104. In embodiments, substrate 102 can take the form of a bulk semiconductor substrate and one or both of upper and lower boundary layers 106, 108 can be a form of etch stop layer, such as a layer of modified bulk semiconductor material. For example, where substrate 102 includes bulk silicon, one or both of upper and lower boundary layers 106, 108 can be modified by adding germanium (Ge) to form a respective silicon-germanium (SiGe) layer, such as with one or more of the techniques described above, which can act as an etch stop layer as is known in the art.

Figure 4:
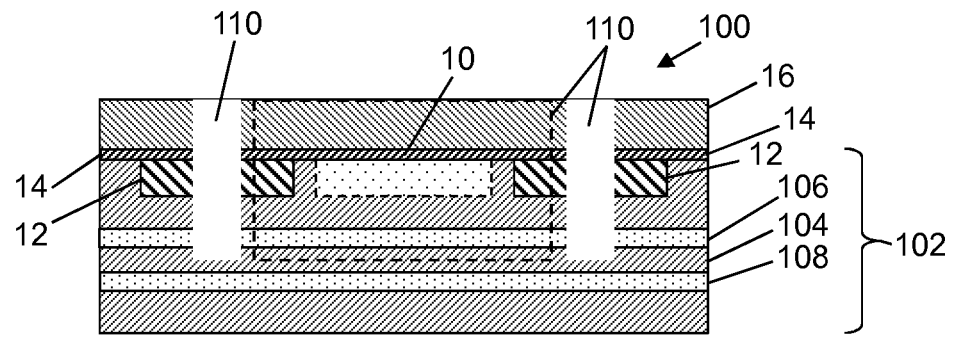

With reference to FIG. 4, at least one cavity, such as at least one trench 110, can be formed near active area 10 from a top of device 100 through any intervening layer(s) and/or material(s) to at least a top of upper boundary layer 106. For example, four trenches 110 can be formed as seen in FIG. 4, with trenches 110 not sectioned being shown in dashed lines. In embodiments including STI structures 12 and/or STI barrier layer 14, trench(es) 110 can extend therethrough. To form trench(es) 110 all the way from a top surface of semiconductor device 100 to target layer 104 may require more than one process, depending on the chemical properties of the various materials therebetween, and such processes are well known in the art. Thus, a first process might be used to form trench(es) 110 from the top surface to upper boundary layer 106, and a second process might be used to continue trench(es) 110 through upper layer 106 to and/or through target layer 104. Each such process can be any suitable known method, such as photolithographic patterning, exposure, and etching, though any other suitable technique or method can be used.

Figure 5:
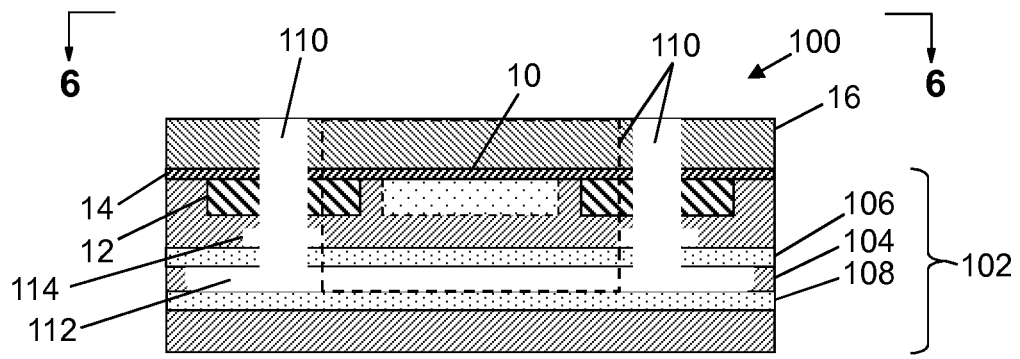

As illustrated in FIG. 5, trench(es) 110 can be used to form a lateral cavity 112 in target layer 104, such as by lateral etching. For example, where target layer 104 includes a semiconductor material, a solution that is chemically reactive with the semiconductor material in target layer 104, but not chemically reactive with boundary layers 106, 108, can be introduced to target layer 104, such as through trench(es) 110. Suitable lateral etching solutions can include, but are not limited to, ammonium hydroxide and potassium hydroxide, and the implementation of lateral etching is well known to those skilled in the art.

Depending upon the particular properties of substrate 102 and target layer 104, some lateral etching can occur along a top of upper boundary layer 106 to form incidental cavity(ies) 114 as seen in FIG. 5. Formation of incidental cavities 114 can be avoided by protecting a sidewall of trench(es) 110 from lateral etching by additional process steps, such as, for example, a blanket deposition and etch of a barrier layer to form sidewall spacers inside the trench 110, prior to the lateral etching.

FIG. 6 shows a top view of the structure of FIG. 5 taken from line 6-6 and illustrates that four trenches 110 can be formed around active area 10 according to embodiments as in the examples described above, and also shows STI structures 12 and lateral cavity 112 in dashed lines. As may be observed, trenches 110 lie on a rectangle around active area 10, and it should be noted that the corners of the rectangle should remain intact for structural and other reasons as is known in the art. FIG. 6 also shows line 5-5 along which a cross section is taken for FIG. 5. Structure material can be deposited in trench(es) 110 and lateral cavity 112, such as by exposing device 100 to a deposition stream of structure material until trench(es) 110 and lateral cavity 112 are filled by the structure material, much as with the examples described above. Any suitable deposition method can be used to deposit structure material in trench(es) 110 and/or lateral cavity 112, such as any of the methods disclosed above, including, but not limited to, CVD, PVD, ECD, MBE, and/or ALD, and/or any suitable combination thereof.

Figure 7:
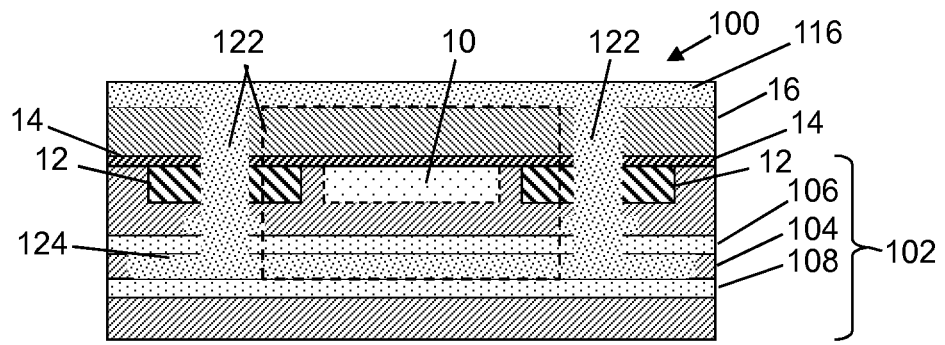
FIG. 7 is a schematic cross-sectional view of an additional stage of fabrication of a heat dissipative electrical isolation/insulation structure according to an embodiment of the invention disclosed herein as illustrated in FIGS. 1-6.

As a result of deposition of structure material, as seen in FIG. 7, at least one column 122 of structure material can be formed, extending from a top surface of device 100 and/or of BPSG layer 16 to target layer 104 and through any intervening layer(s) and/or material(s). In addition, a lateral portion 124 of structure material can be formed extending from at least one column 122 substantially parallel to target layer 124, here also shown as in target layer 104 between upper boundary layer 106 and lower boundary layer 108. However, as also illustrated in FIG. 7, deposition of structure material can result in formation of an excess layer 116 of structure material. Excess material can be removed to expose the top of device 100 and/or electrical insulator layer 16, as seen in FIG. 1, and can yield heat dissipative electrical isolation/insulation structure 120 including column(s) 122 and lateral portion 124 of structure material extending from at least one column 122 between upper boundary layer 106 and lower boundary layer 108. For example, excess layer 116 can be etched and/or planarized to expose electrical insulator layer 16, though any other suitable process can be employed. Microfabrication of device 100 can then continue through any remaining BEOL processes, such as wiring and/or packaging and/or any other processes as may be suitable and/or desired and as known in the art.

To ensure proper operation of heat dissipative electrical isolation structure 120, the structure material should have appropriate electrical and thermal properties such that the structure material is thermally conductive enough, yet electrically insulating enough, that heat can be dissipated as desired while maintaining a desired level of electrical insulation/isolation. For example, a thermal conductivity of the structure material should have thermal conductivity greater than that of silicon dioxide, such as at least twice a respective thermal conductivity of silicon dioxide. For many applications, it has been determined that the insulative properties of $SiO_2$ are far beyond what is actually needed, and electrical conductivity of the structure material thus does not need to be as low as that of silicon dioxide. For example, the structure material can have an electrical conductivity as much as eight orders of magnitude greater than a respective electrical conductivity of silicon dioxide, yet still provide ample electrical isolation and/or insulation, though this is not to be interpreted as limiting in any way since particular applications may require lower or higher electrical conductivity of the structure material. In addition, while examples of threshold values for thermal and electrical conductivity may be provided, it should be understood that the particular thermal conductivity and/or electrical conductivity suitable for a particular implementation can be frequency- and/or temperature-dependent. Thus, while a material might possess thermal and/or electrical conductivity that does not appear to satisfy a respective threshold value at room temperature and/or at a particular frequency or absence thereof, the thermal and/or electrical conductivity at operating temperature and/or frequency might satisfy the respective threshold value, and vice versa.

In embodiments, rather than specifying a threshold value for thermal and/or electrical conductivity, a material known to perform sufficiently for a given set of operating conditions can be identified, such as through experimentation and/or other documentation of material performance. Some examples of suitable materials are shown in TABLE I, below, along with some unsuitable materials for comparison, though it should be apparent that any material with appropriate thermal and electrical properties can be used. For example, embodiments can employ aluminum nitride (AlN) since it performs suitably at typical operating temperature and/or frequency and/or has a thermal conductivity of 285 W/m/K and an electrical conductivity of about $10^{-14}$ S/m. While not quite as electrically insulating as silicon dioxide ($SiO_2$), with electrical conductivity three orders of magnitude more than that of $SiO_2$, this level of electrical conductivity has been found to be more than adequate in many applications. In addition, AlN is nearly twice as thermally conductive as Si and more than two hundred times as thermally conductive as $SiO_2$, which is more than satisfactory for most applications. Further, fabrication of AlN is relatively easy to include in a typical microfabrication system and/or process, particularly at the beginning of or early in a BEOL portion of microfabrication. It should be noted that use of "microfabrication" is not limiting to fabrication of micrometer-scale structures and is inclusive of fabrication of smaller structures, such as, for example, 90 nanometer (nm), 45 nm, 32 nm, 14 nm, and smaller structures as may be possible now and/or as may become possible.

TABLE 1

| Materials | Electrical Conductivity (S/m) | Thermal Conductivity (W/m/K) |
|---|---|---|
| Si | ~$10^{-3}$ | ~149 |
| $SiO_2$ | ~$10^{-18}$ | ~1.38 |
| Sapphire | ~$10^{-16}$ | ~41.9 |
| Aluminum Nitride (AlN) | ~$10^{-14}$ | ~285 |
| Beryllium Oxide (BeO) | ~$10^{-15}$ | ~330 |
| Alumina | ~$10^{-14}$ | ~40 |

In the example of FIGS. 1 and 3-7, substrate 102 was described as any suitable substrate and target layer 104 was described as any layer as might be desired. Thus, substrate 102 was inclusive of bulk semiconductor substrate, such as bulk silicon (Si), and/or SOI, and/or any other suitable substrate, and target layer 104 could take the form of a layer of modified semiconductor material, an oxide layer, such as a BOX layer of a SOI substrate, and/or any other layer of material as might be suitable and/or appropriate. Where one of upper and lower boundary layers 106, 108 includes a dielectric, such as a BOX layer, extra processes may need to be performed and implemented slightly differently. Thus, FIGS. 2 and 8-12 are included to illustrate an implementation of embodiments of the invention disclosed herein in a SOI substrate.

Figure 8:
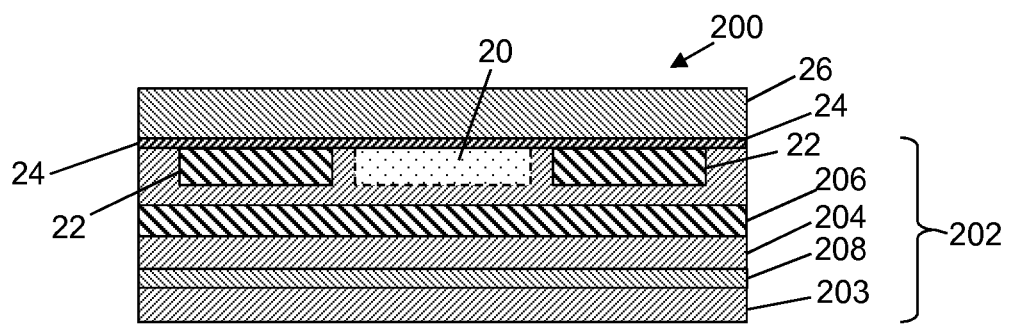
FIGS. 8-12 are schematic cross-sectional views of stages of fabrication of a heat dissipative electrical isolation/insulation structure according to an embodiment of the invention disclosed herein.

Turning now to FIG. 8, a semiconductor device 200 can include an active area 20 formed in a SOI substrate 202. As with the example described above, active area 20 can be electrically isolated, such as with STI structures 22, which can each bear a portion of a barrier layer 24 thereon. A blanket electrical insulator layer 26, such as a doped glass layer, can be formed atop SOI substrate 202 over active area 20 and/or STI structures 22 and barrier layer 24. SOI substrate 202 can include a handle wafer 203, as well as a target layer 204 between a BOX layer 206 and a lower boundary layer 208 of a material with different chemical properties than target layer 204 such that lower boundary layer 208 can act as a stop layer. For example, lower boundary layer 208 can be a layer of semiconductor material implanted with another material, such as silicon implanted with boron or another dopant, can be a layer of semiconductor material modified using another semiconductor, or can be a layer otherwise modified using and/or of another suitable material as can be selected by one skilled in the art. By way of an example of modification using another semiconductor, where handle wafer 203 includes Si, lower boundary layer 208 can include SiGe, which can be formed prior to device formation as described above. Also as above, while lower boundary layer 208 could be construed as a target layer, here it acts as a stop layer to prevent trench(es) 210 from extending beyond target layer 104.

Figure 9:
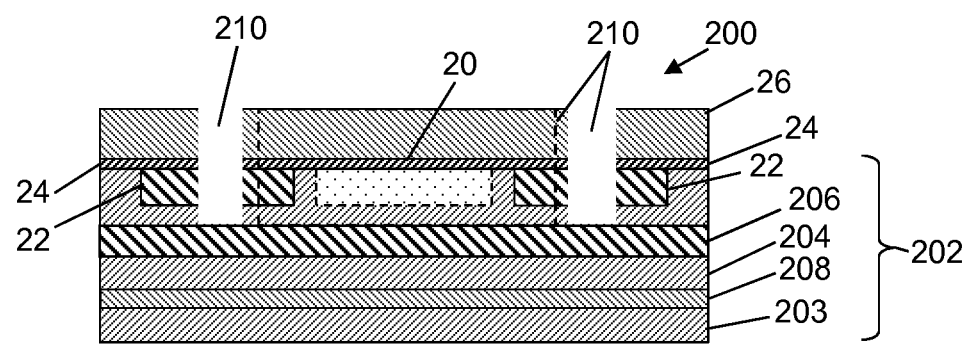
Figure 10:
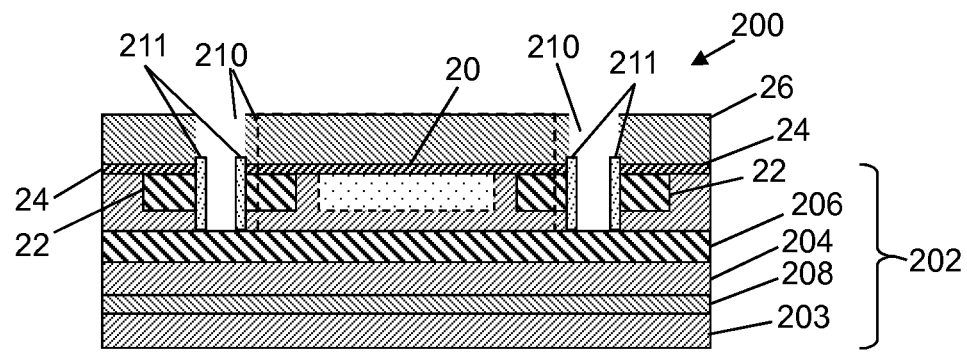

FIG. 9 shows at least one cavity, such as at least one trench 210, formed in much the same manner as in the examples described above. However, in this example, because of chemical properties of BOX layer 206 that differ from those of upper boundary layer 106 (FIG. 1), trenches 210 are shown in FIG. 9 as extending from a top surface of device 200, through barrier layer 24 and STI structures 22 where present, to a top surface of BOX layer 206. Turning to FIG. 10, should erosion of substrate material above layer 106 and/or erosion of STI structures 22 be undesirable, liners 211 can be formed over surfaces of trench(es) 210 and/or STI structures 22 to prevent erosion of substrate material and/or STI structures 22 during extension of trenches 210 through BOX layer 206 and at least to a top surface of target layer 204. It should be noted that, while not shown in FIGS. 1 and 3-7, liners similar to liners 211 can be used in trench(es) 110 (FIG. 4) to similarly protect against erosion of substrate material and/or STI structures 12 (FIG. 4) to, for example, prevent formation of incidental cavities 114 (FIG. 5).

Figure 11:
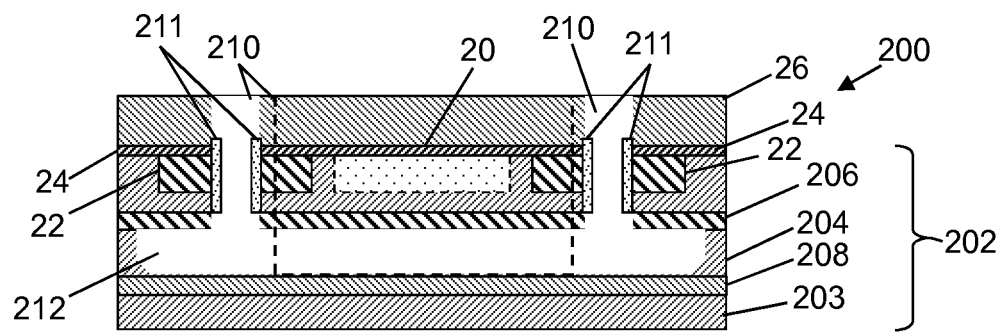

Trench(es) 210 are shown extended to at least a top surface of target layer 204 in FIG. 11, which also shows that a lateral cavity 212 can be formed in target layer 204 to extend from at least one trench 210 parallel to target layer 204, in this case in target layer 204 between BOX layer 206 and lower boundary layer 208. In addition, FIG. 11 illustrates that BOX layer 206 can be thinned, if desired and/or suitable, during formation of lateral cavity 212, such as to improve electrical isolation of active area 20 and/or transmission of heat through BOX layer 206. In some cases, additional processes and/or steps may be needed to suitably thin BOX layer 206, such as, for example, protecting blanket electrical insulator layer 26 with a layer of protective material and/or forming liner(s) 211 in trench(es) 210, and/or other processes as would be known to one skilled in the art. A top view of the structure of FIG. 11 would appear much as that shown in FIG. 6, where four trenches 210 and lateral cavity 212 would be seen in place of trenches 110 and lateral cavity 112. As with the examples described above, trenches 210 can lie on a rectangle around active area 20, and the corners of the rectangle can be left intact for structural and other reasons as is known in the art. Structure material can be deposited in trench(es) 210 and lateral cavity 212, such as by exposing device 200 to a deposition stream of structure material until trench(es) 210 and lateral cavity 212 are filled by the structure material, much as in the example of FIGS. 1 and 3-7. As above, any suitable and/or desired deposition method can be employed to deposit structure material.

Figure 12:
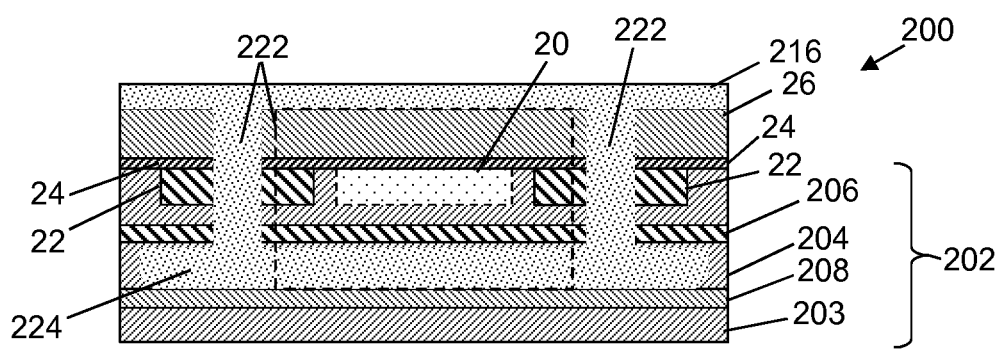
Figure 13:
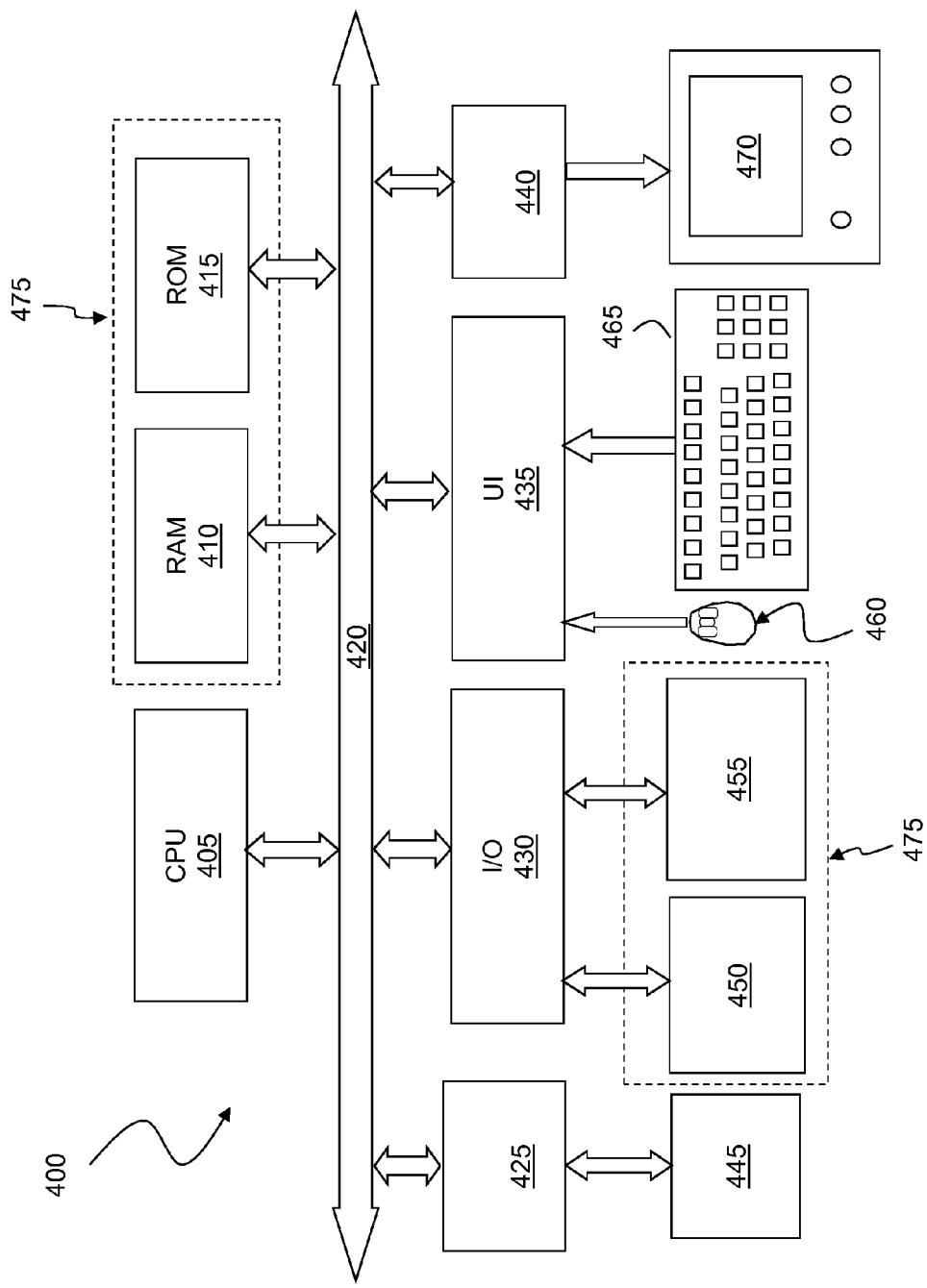
FIG. 13 is a schematic block diagram of a general purpose computer system which may be used to practice aspects of embodiments of the invention disclosed herein.

Turning now to FIG. 12, deposition of structure material can form at least one column 222 of structure material extending from a top surface of device 200 to target layer 204 and through any intervening layer(s) and/or material(s). It should be noted that, as in the example of FIGS. 1 and 3-7, dashed lines are used to represent components, such as column(s) 222 of structure material, not sectioned but that may still be of note. In addition, a lateral portion 224 of structure material can be formed extending from at least one column 222 substantially parallel to target layer 204, here shown as in target layer 204 between BOX layer 206 and lower boundary layer 208. However, structure material deposition can also form an excess layer 216 of structure material as seen in FIG. 13, which can be removed. For example, excess structure material can be etched and/or planarized to expose the top of device 200 and/or doped glass layer 26 as seen in FIG. 2, though any other suitable process can be employed.

As also seen in FIG. 2, a heat dissipative electrical isolation/insulation structure 220 can include column(s) 222 of structure material, as well as lateral portion 224 of structure material. Heat dissipative electrical isolation/insulation structure 220 can enhance electrical isolation of active area 20 with proper selection of structure material, as suggested above and as described below. Heat dissipative electrical isolation/insulation structure 220 can also draw and/or receive heat from active area 20 and can dissipate such heat by transferring the heat to lower or other portions of substrate 202. In particular, heat can be transferred from lateral portion 224 to lower boundary layer 208, which can dissipate heat through its extent and/or transfer heat to lower portions of substrate 202, such as to handle wafer 203. Microfabrication of device 200 can then continue through any remaining BEOL processes, such as wiring and/or packaging and/or any other processes as may be suitable and/or desired and as known in the art.

With appropriate material selection, heat dissipative electrical insulation structure 120, 220 advantageously can dissipate heat and/or conduct heat away from active area 10, 20 while providing and/or maintaining electrical insulation and/or isolation of active area 10, 20. For example, each column 122, 222 can conduct heat generated by active area 10, 20 to target layer 104, 204 and/or lower boundary layer 108, 208 and/or other portions of substrate 102, 202, which can then dissipate such heat as is known in the art. Further, embodiments including lateral portion 124, 224 can provide additional heat dissipation and/or conduction capacity and can enhance heat transfer between each column 122, 222 and target layer 104, 204 and/or lower boundary layer 108, 208 by enlarging an area of contact with target layer 104, 204 and/or lower boundary layer 108, 208. Lateral portion 124, 224 can also act as a heat sink to generally maintain temperature at a lower level than would be maintained according to prior art techniques. For example, if active area 10, 20 undergoes a period of elevated heat output, such heat can be transferred to column(s) 122, 222 and/or lateral portion 124, 224 such that active area 10, 20 can experience less of a temperature increase than would otherwise occur. Further, embodiments can provide improved electrical isolation, particularly where implemented in a bulk substrate 100, such as in the example of FIGS. 1 and 3-7.

A heat dissipative electrical insulation structure according to embodiments of the invention disclosed herein may be implemented as a circuit design structure. FIG. 13 illustrates a block diagram of a general-purpose computer system which can be used to implement the circuit and circuit design structure described herein. The design structure may be coded as a set of instructions on removable or hard media for use by general-purpose computer. FIG. 13 is a schematic block diagram of a general-purpose computer for practicing the present invention. FIG. 13 shows a computer system 400, which has at least one microprocessor or central processing unit (CPU) 405. CPU 405 is interconnected via a system bus 420 to machine readable media 475, which includes, for example, a random access memory (RAM) 410, a read-only memory (ROM) 415, a removable and/or program storage device 455 and a mass data and/or program storage device 450. An input/output (I/O) adapter 430 connects mass storage device 450 and removable storage device 455 to system bus 420. A user interface 435 connects a keyboard 465 and a mouse 460 to system bus 420, and a port adapter 425 connects a data port 445 to system bus 420 and a display adapter 440 connect a display device 470. ROM 415 contains the basic operating system for computer system 400. Examples of removable data and/or program storage device 455 include magnetic media such as floppy drives, tape drives, portable flash drives, zip drives, and optical media such as CD ROM or DVD drives. Examples of mass data and/or program storage device 450 include hard disk drives and non-volatile memory such as flash memory. In addition to keyboard 465 and mouse 460, other user input devices such as trackballs, writing tablets, pressure pads, microphones, light pens and position-sensing screen displays may be connected to user interface 435. Examples of display device 470 include cathode-ray tubes (CRT) and liquid crystal displays (LCD).

A machine readable computer program may be created by one of skill in the art and stored in computer system 400 or a data and/or any one or more of machine readable medium 475 to simplify the practicing of this invention. In operation, information for the computer program created to run the present invention is loaded on the appropriate removable data and/or program storage device 455, fed through data port 445 or entered using keyboard 465. A user controls the program by manipulating functions performed by the computer program and providing other data inputs via any of the above mentioned data input means. Display device 470 provides a means for the user to accurately control the computer program and perform the desired tasks described herein.

Figure 14:
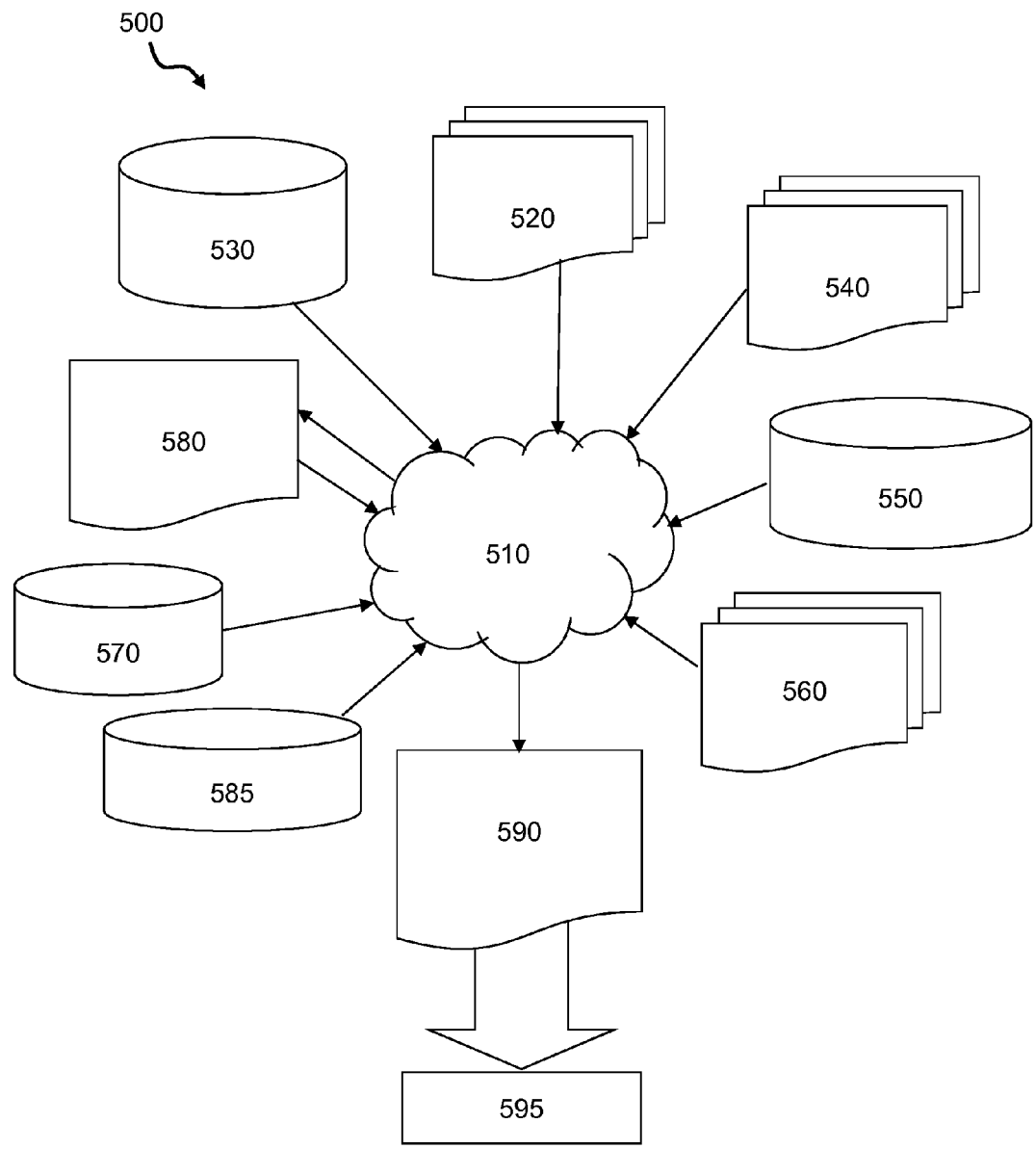
FIG. 14 is a schematic flow diagram of a design process used in semiconductor design, manufacturing, and/or test that may be applied to aspects of embodiments of the invention disclosed herein.

FIG. 14 shows a block diagram of an example design flow 500. Design flow 500 may vary depending on the type of IC being designed. For example, a design flow 500 for building an application specific IC (ASIC) may differ from a design flow 500 for designing a standard component. Design structure 520 is preferably an input to a design process 510 and may come from an IP provider, a core developer, or other design company or may be generated by the operator of the design flow, or from other sources. Design structure 520 can comprise heat dissipative electrical insulation structure 120, 220 in the form of schematics or HDL, a hardware-description language (e.g., Verilog, VHDL, C, etc.). Design structure 520 may be contained on one or more machine readable medium. For example, design structure 520 may be a text file or a graphical representation of heat dissipative electrical insulation structure 120, 220. Design process 510 preferably synthesizes (or translates) heat dissipative electrical insulation structure 120, 220 into a netlist 580, where netlist 580 is, for example, a list of wires, transistors, logic gates, control circuits, I/O, models, etc., that describes the connections to other elements and circuits in an integrated circuit design and recorded on at least one of machine readable medium. This may be an iterative process in which netlist 580 is re-synthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 50 nm, etc.), design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Ultimately, design process 510 preferably translates heat dissipative electrical insulation structure 120, 220 and/or method of making, along with the rest of the integrated circuit design (if applicable), into a final design structure 590 (e.g., information stored in a GDS storage medium). Final design structure 590 may comprise information such as, for example, test data files, design content files, manufacturing data, layout parameters, wires, levels of metal, vias, shapes, test data, data for routing through the manufacturing line, and any other data required by a semiconductor manufacturer to produce heat dissipative electrical insulation structure 120, 220 and/or method of making Final design structure 580 may then proceed to a stage 585 where, for example, final design structure 580 proceeds to tape-out, is released to manufacturing, is sent to another design house or is sent back to the customer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a semiconductor device comprising:
    an active area in at least one layer of a semiconductor device, the at least one layer including a target layer below the active area, and at least one of an upper boundary layer between the target layer and the active area or a lower boundary layer below the target layer, wherein the substrate includes silicon (Si), and the at least one of an upper boundary layer and a lower boundary layer includes adding germanium (Ge) to the substrate, the at least one of an upper boundary layer and a lower boundary layer thereby including silicon germanium (SiGe);
    at least one column of a structure material extending from a top of the semiconductor device through the upper boundary layer to the target layer; and
    at least one lateral portion of the structure material extending from the at least one column below and substantially parallel to the upper boundary layer.

2. The structure of claim 1, wherein the structure material includes a thermal conductivity at least twice a respective thermal conductivity of silicon dioxide and an electrical conductivity no more than eight orders of magnitude greater than a respective electrical conductivity of silicon dioxide.

3. The structure of claim 1, wherein the structure includes the lower boundary layer and further includes the upper boundary layer including a dielectric material.

4. The structure of claim 3, wherein substrate is a silicon-on-insulator (SOI) substrate and the dielectric material of the upper boundary layer includes a buried oxide (BOX) layer of the SOI substrate.

5. The structure of claim 1, wherein the structure includes the lower boundary layer, and further comprising the lower boundary layer substantially parallel to and spaced apart from the upper boundary layer, the target layer lying therebetween.

6. The structure of claim 1, wherein the structure includes the lower boundary layer, and the substrate includes a semiconductor material and the upper boundary layer includes the semiconductor material doped with at least one impurity.

7. The structure of claim 1, wherein the structure includes the lower boundary layer, and the substrate includes a first semiconductor material and the upper boundary layer includes a second semiconductor.

8. The structure of claim 1, wherein the structure material includes at least one of aluminum nitride (AlN), beryllium oxide (BeO), sapphire, and alumina.

9. A method comprising:
    designating an active area of a substrate, the substrate including a target layer below the active area and at least one of an upper boundary layer between the target layer and the active area or a lower boundary layer below the target layer;
    forming the at least one of an upper boundary layer and a lower boundary layer, wherein the substrate includes silicon (Si), and the forming of the at least one of an upper boundary layer and a lower boundary layer includes adding germanium (Ge) to the substrate, the at least one of an upper boundary layer and a lower boundary layer thereby including silicon germanium (SiGe);
    forming at least one column of a substantially non-metallic structure material adjacent the active area from a top of the substrate to the target layer; and forming at least one lateral portion of the structure material to extend from the at least one column in the target layer.

10. The method of claim 9, wherein the forming of the at least one column includes forming at least one trench in the substrate and depositing structure material in the at least one trench.

11. The method of claim 10, wherein the forming of the at least one lateral portion includes performing lateral etching via the at least one trench to form a lateral cavity extending from a bottom of the at least one trench substantially parallel to the at least one of an upper boundary layer and a lower boundary layer before the depositing of the structure material.

12. The method of claim 11, wherein the substrate includes the lower boundary layer and further includes the upper boundary layer, is a silicon-on-insulator (SOI) substrate, and the upper boundary layer includes a buried oxide (BOX) layer of the SOI substrate.

13. The method of claim 12, further comprising thinning the BOX layer before the depositing of the structure material.

14. The method of claim 9, wherein the structure material includes a thermal conductivity at least twice a respective thermal conductivity of silicon dioxide and an electrical conductivity no more than eight orders of magnitude greater than a respective electrical conductivity of silicon dioxide.

15. The method of claim 9, wherein the structure material includes at least one of aluminum nitride (AlN), beryllium oxide (BeO), sapphire, and alumina.

16. A design structure readable by a machine used in design, manufacture, or simulation of an integrated circuit, the design structure comprising:
   an active area in at least one layer of a semiconductor device;
   a target layer below the active area;
   a lower boundary layer below the target layer and an upper boundary layer between the target layer and the active area;
   at least one column of a structure material extending from a top of the semiconductor device to the target layer; and
   at least one lateral portion of the structure material extending from the at least one column.

17. The design structure of claim 16, wherein the design structure comprises a netlist.

18. The design structure of claim 16, wherein the design structure resides on non-transitory storage medium as a data format used for an exchange of layout data of integrated circuits.

19. The design structure of claim 16, wherein the design structure resides in a programmable gate array.

* * * * *